(12) United States Patent
Tsai

(10) Patent No.: US 11,652,014 B2
(45) Date of Patent: May 16, 2023

(54) ELECTRONIC PACKAGE AND METHOD OF MANUFACTURING THE SAME

(71) Applicant: Advanced Semiconductor Engineering, Inc., Kaohsiung (TW)

(72) Inventor: Chung-Yuan Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 125 days.

(21) Appl. No.: 17/039,999

(22) Filed: Sep. 30, 2020

(65) Prior Publication Data

US 2022/0102233 A1    Mar. 31, 2022

(51) Int. Cl.
| H01L 23/31 | (2006.01) |
| H01L 23/00 | (2006.01) |
| H01L 27/06 | (2006.01) |
| H01L 21/50 | (2006.01) |

(52) U.S. Cl.
CPC .......... *H01L 23/3128* (2013.01); *H01L 21/50* (2013.01); *H01L 23/562* (2013.01); *H01L 27/0688* (2013.01)

(58) Field of Classification Search
None
See application file for complete search history.

(56) References Cited

U.S. PATENT DOCUMENTS

| 8,513,792 | B2 | 8/2013 | Ganesan et al. |
| 9,633,937 | B2 | 4/2017 | Fei et al. |
| 2012/0159118 | A1* | 6/2012 | Wong ............... H01L 25/105 257/737 |
| 2019/0131241 | A1* | 5/2019 | Jeng ............... H01L 25/105 |
| 2021/0193589 | A1* | 6/2021 | Pei ............... H01L 23/49822 |
| 2022/0077130 | A1* | 3/2022 | Kim ............... H01L 21/6835 |

* cited by examiner

*Primary Examiner* — Jay C Chang
(74) *Attorney, Agent, or Firm* — Foley & Lardner LLP

(57) ABSTRACT

An electronic package and method for manufacturing the same are provided. The electronic package includes a first conductive structure, a second conductive structure, an electronic component, an underfill and a dam structure. The second conductive structure is disposed on the first conductive structure, wherein the second conductive structure defines a cavity over the first conductive structure. The electronic component is disposed on the first conductive structure and at least partially disposed in the cavity. The underfill is disposed between the first conductive structure and the electronic component. The dam structure is disposed on the first conductive structure and configured to confine the underfill.

18 Claims, 9 Drawing Sheets

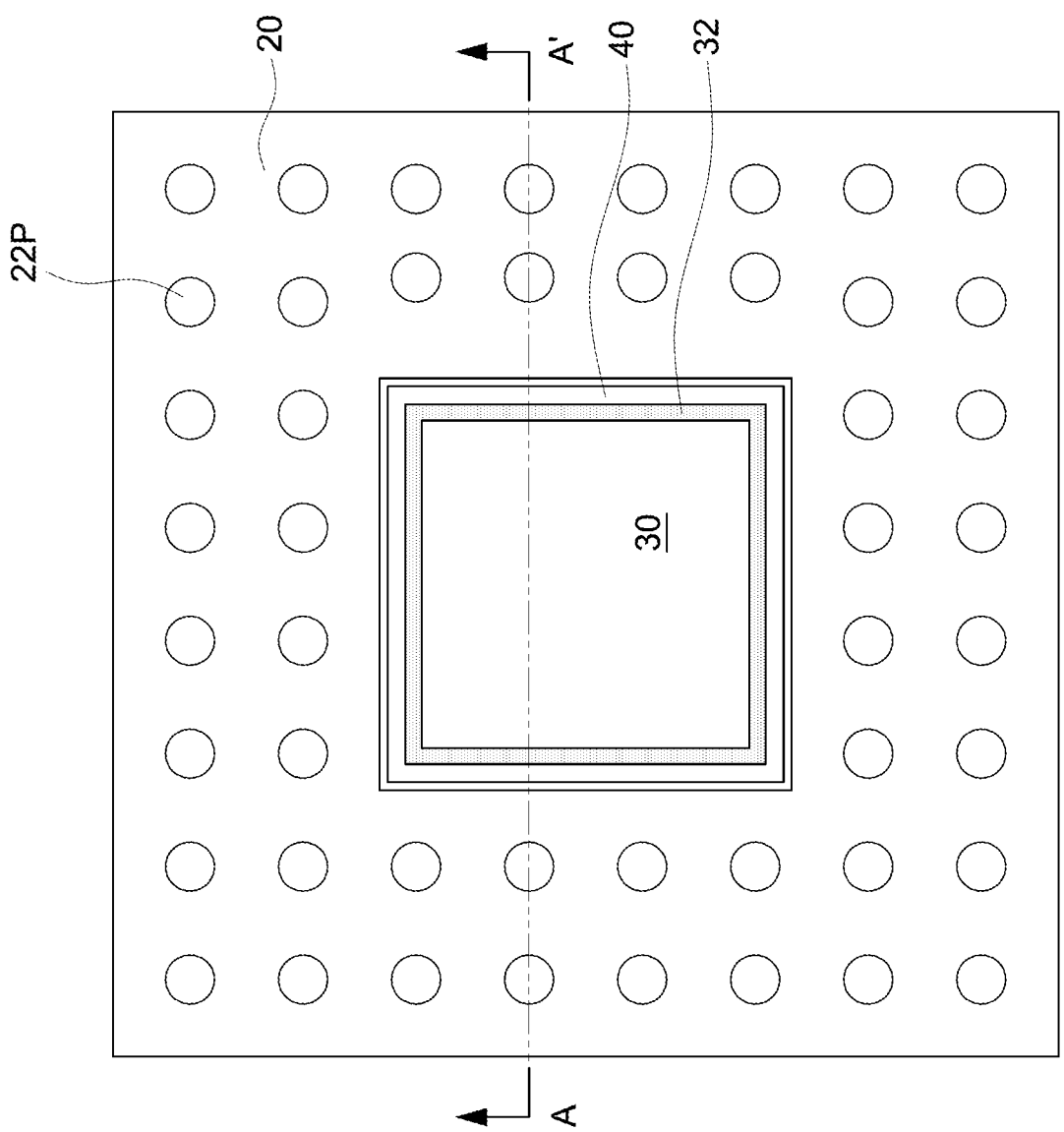

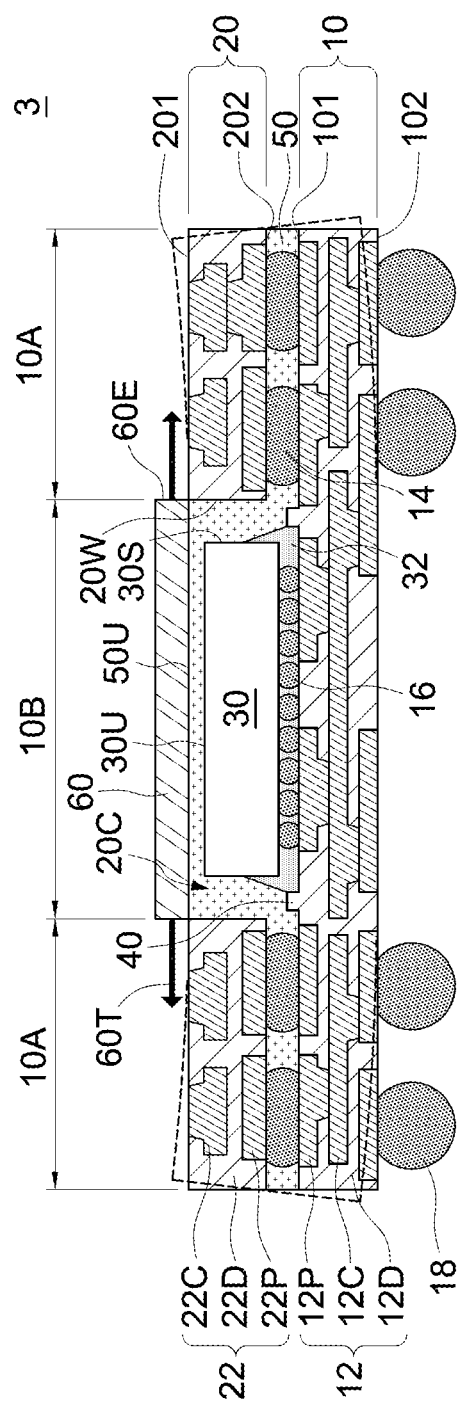
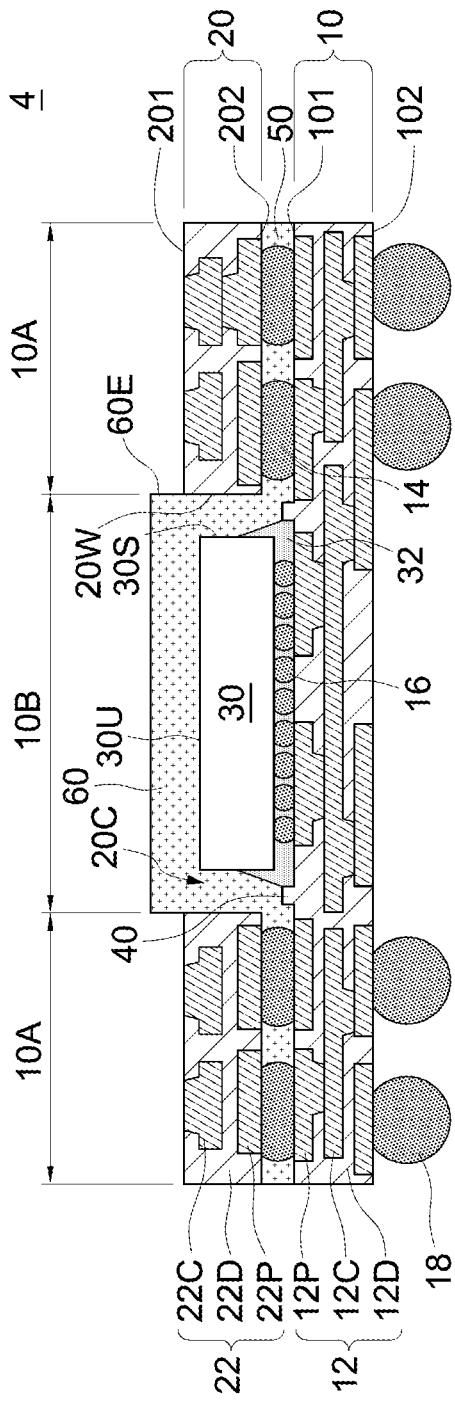
FIG. 3B
FIG. 4

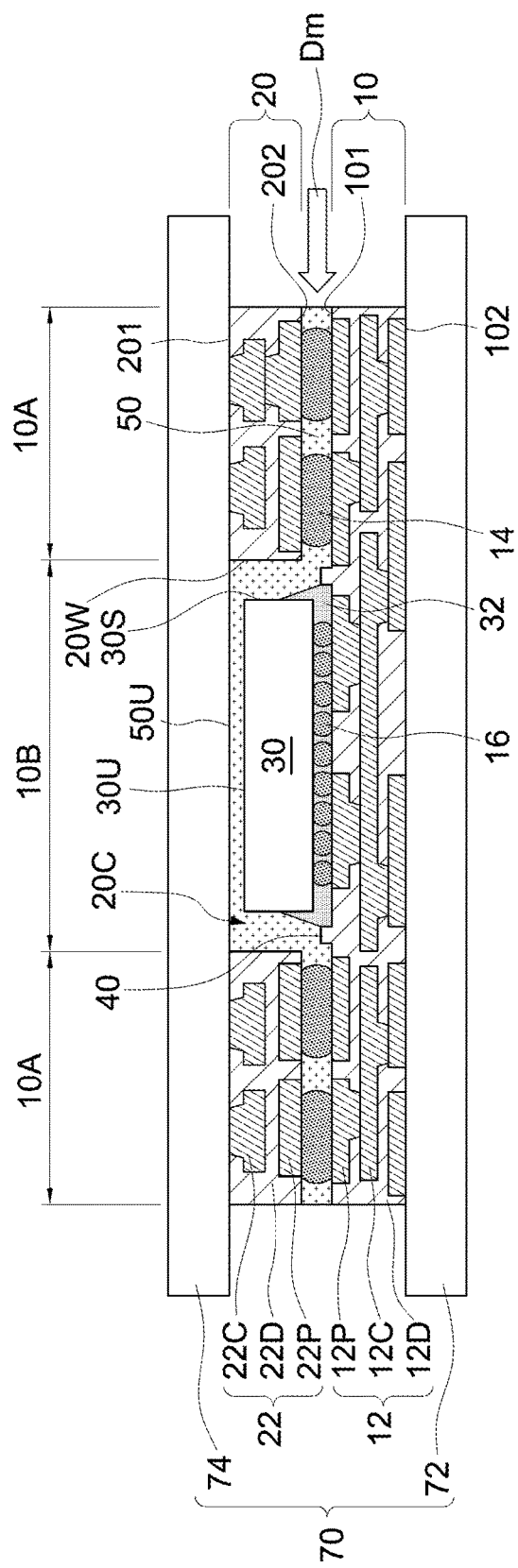
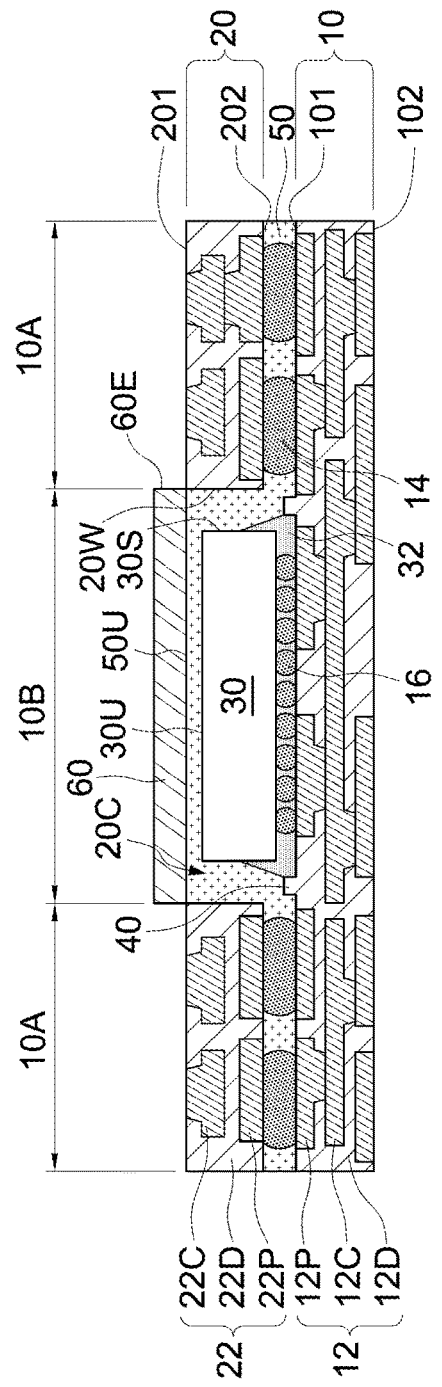
FIG. 5E
FIG. 5F

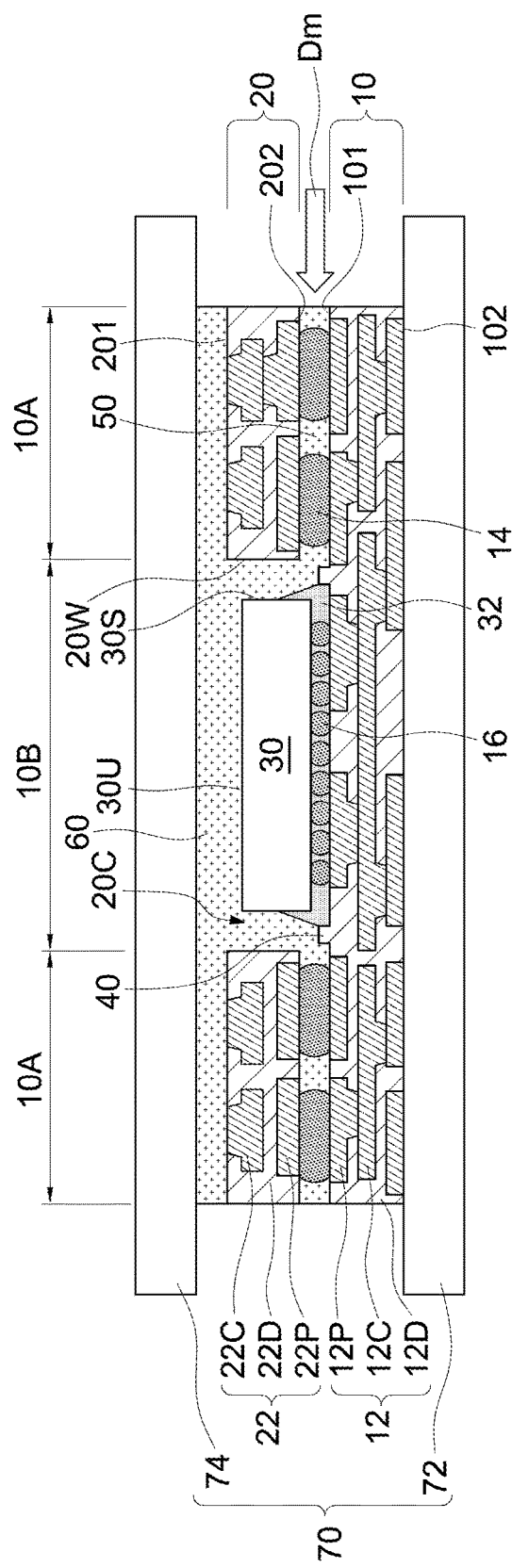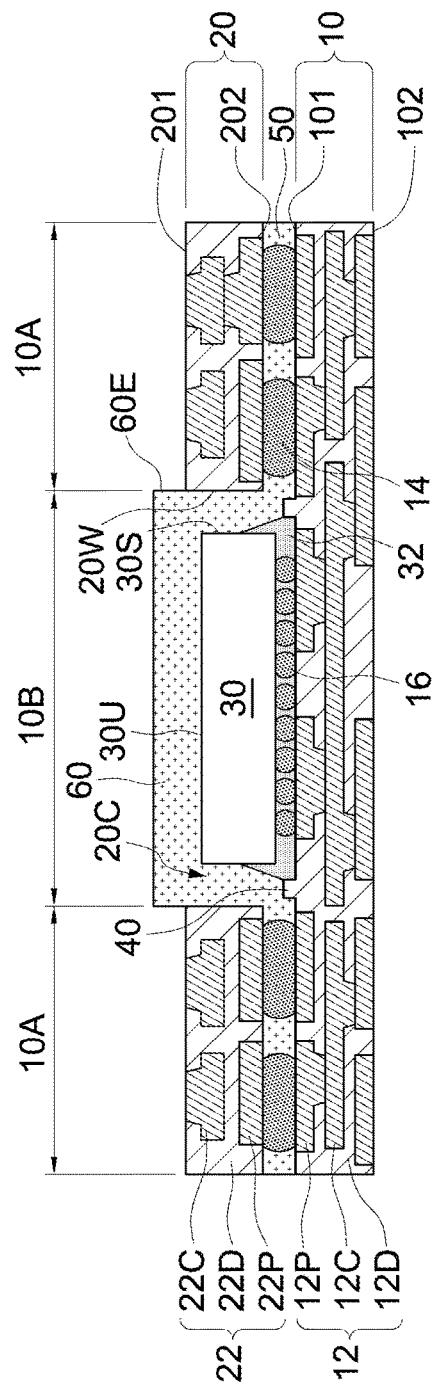

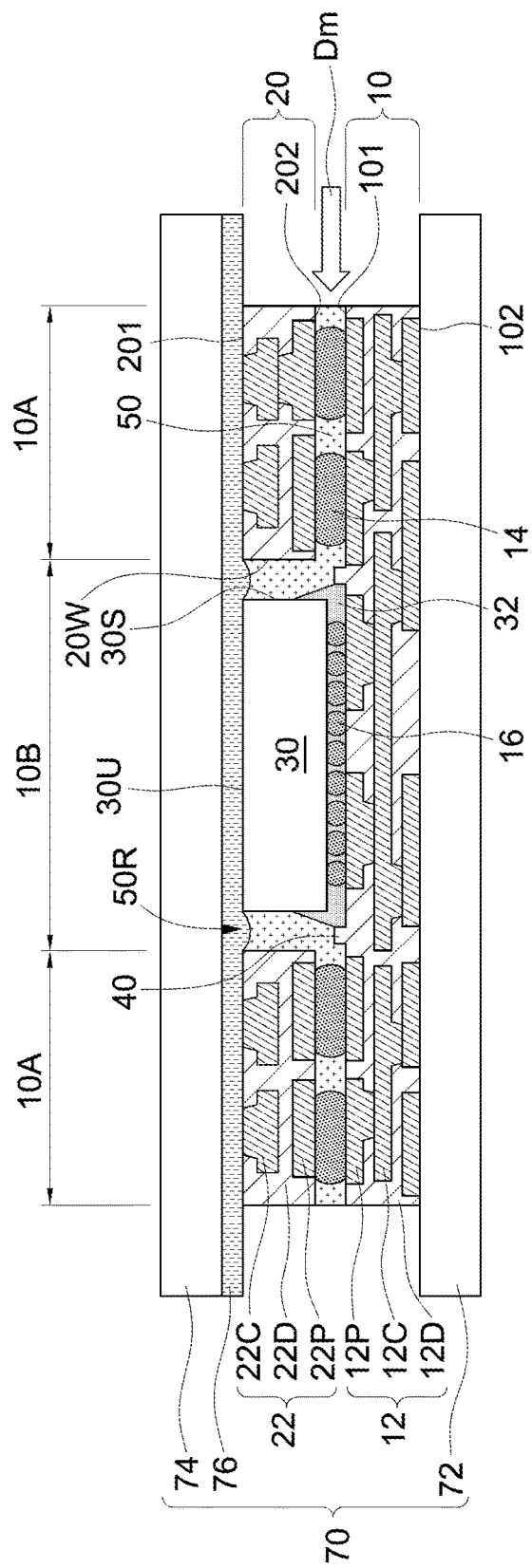
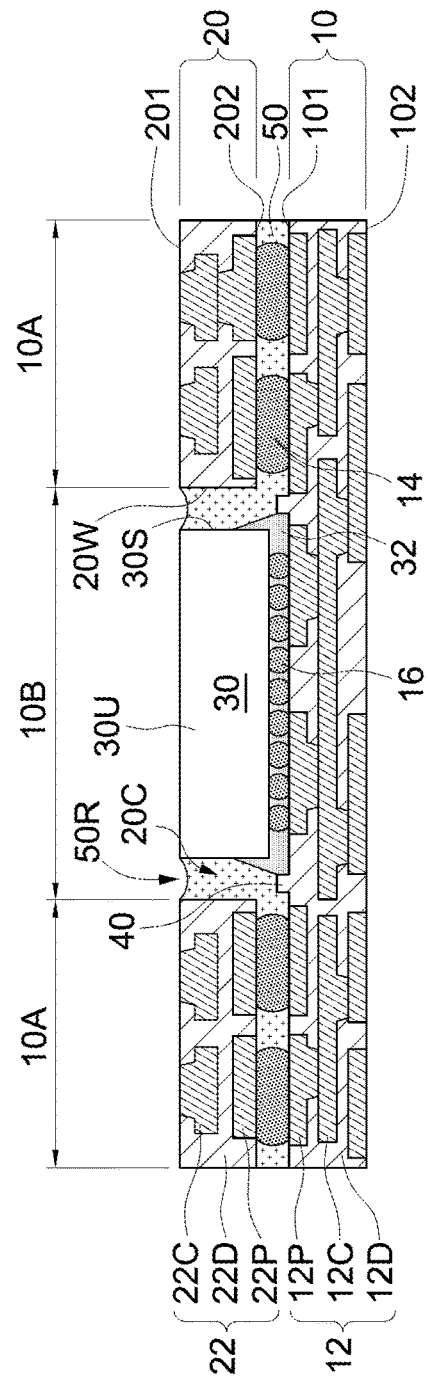
FIG. 7A
FIG. 7B

ELECTRONIC PACKAGE AND METHOD OF MANUFACTURING THE SAME

TECHNICAL FIELD

The present disclosure generally relates to an electronic package and method of manufacturing the same, and more particularly relates to an electronic package including a dam structure that confines locations of an underfill and method of manufacturing the same.

BACKGROUND

A three-dimensional (3D) electronic package such as a package on package (POP) may be subject to large thickness, underfill bleeding and warpage issues due to its stacking structure. Therefore, there is a desire for, for example, but not limited to, an electronic that would alleviate or avoid the problem mentioned above.

SUMMARY

One aspect of the present disclosure relates to an electronic package including a first conductive structure, a second conductive structure, an electronic component, an underfill and a dam structure. The second conductive structure is disposed on the first conductive structure, wherein the second conductive structure defines a cavity over the first conductive structure. The electronic component is disposed on the first conductive structure and at least partially disposed in the cavity. The underfill is disposed between the first conductive structure and the electronic component. The dam structure is disposed on the first conductive structure and configured to confine the underfill.

Another aspect of the present disclosure relates to an electronic package including a first conductive structure, a second conductive structure, an electronic component and a stress compensation layer. The second conductive structure is disposed on the first conductive structure, wherein the second conductive structure defines a cavity over the first conductive structure. The electronic component is disposed on the first conductive structure and at least partially disposed in the cavity. The stress compensation layer is disposed on the cavity.

Another aspect of the present disclosure relates to a method of manufacturing an electronic package. The method includes the following operations. A first conductive structure is provided. The first conductive structure includes a dam structure on a surface of the first conductive structure. An electronic component is bonded to the surface of the first conductive structure in a space defined by the dam structure. An underfill is dispensed between the electronic component and the first conductive structure and the underfill is constrained in the space by the dam structure. A second conductive structure including a cavity is provided. The second conductive structure is disposed on the first conductive structure with the cavity receiving the electronic component.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

FIG. 1 is a schematic top view of an electronic package in accordance with some embodiments of the present disclosure.

FIG. 3B is a schematic view illustrating the stress compensation layer providing a tensile stress on the underlying layers of the electronic package.

FIG. 4 is a schematic cross-sectional view of an electronic package in accordance with some embodiments of the present disclosure.

FIG. 5A, FIG. 5B, FIG. 5C, FIG. 5D, FIG. 5E and FIG. 5F illustrate operations of manufacturing an electronic package in accordance with some embodiments of the present disclosure.

FIG. 6A and FIG. 6B illustrate operations of manufacturing an electronic package in accordance with some embodiments of the present disclosure.

FIG. 7A and FIG. 7B illustrate operations of manufacturing an electronic package in accordance with some embodiments of the present disclosure.

DETAILED DESCRIPTION

Figure 1A:
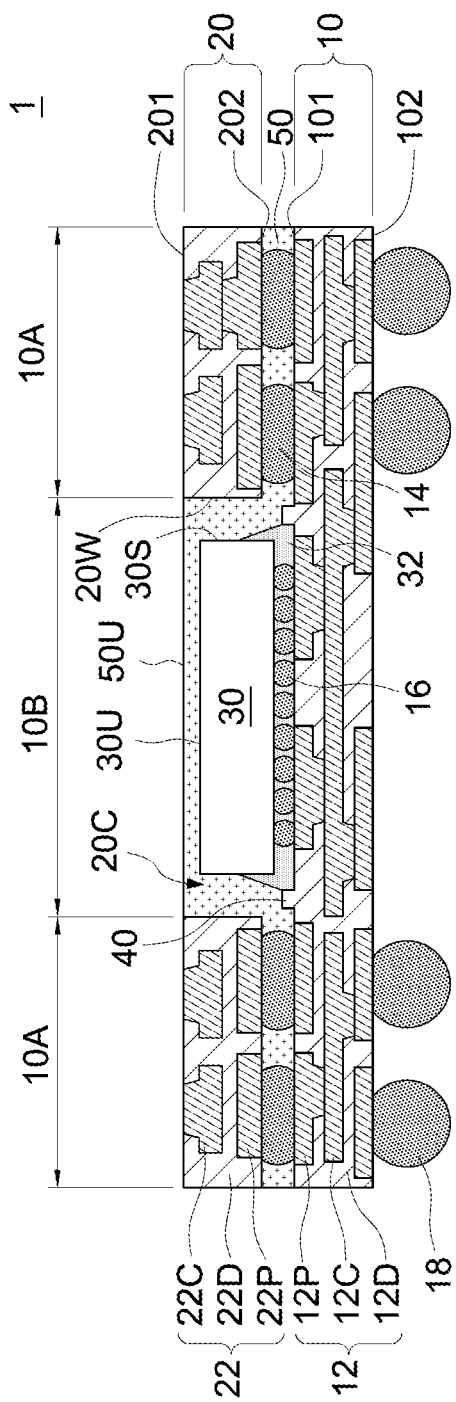
FIG. 1A is a schematic cross-sectional view of an electronic package along a line A-A' of FIG. 1 in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

FIG. 1 is a schematic top view of an electronic package 1 in accordance with some embodiments of the present disclosure, and FIG. 1A is a schematic cross-sectional view of an electronic package 1 along a line A-A' of FIG. 1 in accordance with some embodiments of the present disclosure. It is contemplated that some of the components such as an encapsulant is omitted in FIG. 1 to highlight features of the electronic package 1. As shown in FIG. 1 and FIG. 1A, the electronic package 1 includes a first conductive structure 10, a second conductive structure 20, an electronic component 30, an underfill 32 and a dam structure 40. The first conductive structure 10 may include a first circuit layer 12. The first circuit layer 12 may include one or more conductive layers 12C and one or more insulative layer(s) 12D alternately stacked. The material of the conductive layer(s) may include, but is not limited to, metal such as copper. The material of the insulative layer(s) may include organic insulative material such as epoxy resin, bismaleimide-triazine (BT) resin, inorganic insulative material such as silicon oxide, silicon nitride, or a combination thereof.

In some embodiments, some of the conductive layers 12C of the first circuit layer 12 may include bonding pads 12P exposed from an upper surface 101 and/or a lower surface 102 of the first conductive structure 10. The circuit layer 12 may include a substrate-level circuit layer. By way of example, the line width/spacing (L/S) of the circuit layer 12 may, but is not limited to, be equal to or greater than about 10 μm/about 10 μm. The substrate-level circuit layer may be patterned and defined by e.g., laser drilling-plating-etching technique. The first circuit layer 12 may include a bumping-level circuit layer. By way of example, the L/S of the first circuit layer 12 may be lower than about 10 μm/about 10 μm such as between about 2 μm/about 2 μm and about 5 μm/about 5 μm or even lower than about 2 μm/about 2 μm. The bumping-level circuit layer may be patterned and defined by e.g., photolithography-plating-etching technique.

In some embodiments, the first conductive structure 10 may include a first region 10A and a second region 10B. By way of example, the first region 10A may include a hollow frame shape, and the second region 10B may include a rectangular shape surrounded by the first region 10A.

The second conductive structure 20 is disposed on the first conductive structure 10. The second conductive structure 20 defines a cavity 20C over the first conductive structure 10. For example, the second conductive structure 20 may include a hollow frame structure, which defines sidewalls 20W of the cavity 20C while a bottom and a top of the cavity 20C is open. The shape of the cavity 20C may be rectangular shape or any other geometric shape. The second conductive structure 20 may be disposed over the first region 10A, and cavity 20C may be disposed over the second region 10B.

In some embodiments, the second conductive structure 20 may include a substrate interposer, a semiconductor interposer or the like. The second conductive structure 20 may include a second circuit layer 22. The second circuit layer 22 may include one or more conductive layers 22C and one or more insulative layer(s) 22D alternately stacked. The material of the conductive layer(s) may include, but is not limited to, metal such as copper. The material of the insulative layer(s) may include organic insulative material such as epoxy resin, bismaleimide-triazine (BT) resin, inorganic insulative material such as silicon oxide, silicon nitride, or a combination thereof. In some embodiments, some of the conductive layers 22C of the second circuit layer 22 may include bonding pads 22P exposed from an upper surface 201 and/or a lower surface 202 of the second conductive structure 20. The second circuit layer 22 may include a substrate-level circuit layer or a bumping-level circuit layer. In some embodiments, another electronic component or package such as memory component or memory package may be disposed on the second conductive structure 20 and electrically connected to the second conductive structure 20 through the bonding pads 22P.

In some embodiments, the electronic package 1 may further include a plurality first interconnectors 14 disposed between and electrically connected to the first conductive structure 10 and the second conductive structure 20. By way of example, the first interconnectors 14 may, but is not limited to, include solder interconnectors such as solder balls, conductive pillars or a combination thereof, and electrically connected to a portion of the bonding pads 12P and a portion of the bonding pads 22P.

The electronic component 30 is disposed on the first conductive structure 10 and at least partially disposed in the cavity 20C. The electronic component 30 is disposed over the second region 10B of the first conductive structure 10. The electronic component 30 may include one or more active electronic components such as semiconductor die, one or more passive electronic components such as resistors, capacitors or inductors, or a combination thereof. In some embodiments, the electronic component 30 is electrically connected to the first conductive structure 10 in a flip chip manner. By way of example, the electronic package 1 may further include a plurality of second interconnectors 16 disposed between and electrically connected to the first conductive structure 10 and the electronic component 30. By way of example, the second interconnectors 16 may, but is not limited to, include solder interconnectors such as micro solder bumps, metal interconnectors such as metal pillar or a combination thereof, and electrically connected to another portion of the bonding pads 12P and another portion of the bonding pads 22P.

The underfill 32 is disposed between the first conductive structure 10 and the electronic component 30, and surrounding the second interconnectors 16. The underfill 32 may further climb up a portion of the edge of the electronic component 30. The underfill 32 may be formed by dispensing a flowable material between the first conductive structure 10 and the electronic component 30, and then solidifying the flowable material. Prior to solidification, excessive flowable material may reach or approach the first interconnectors 14, which is known as underfill bleeding. The underfill bleeding would adversely affect the joint of the first interconnectors 14 between the first conductive structure 10 and the second conductive structure 20. Accordingly, the dam structure 40 is disposed on the first conductive structure 10 and configured to confine the underfill 32 such that the bleeding of the underfill 32 can be reduced or alleviated. In some embodiments, the dam structure 40 may be disposed in the second region 10A, which is covered by the second conductive structure 20, and adjacent to the boundary between the first region 10A and the second region 10B. Alternatively, the dam structure 40 is disposed adjacent to a boundary between the first region 10A and the second region 10B of the first conductive structure 10. For example, the dam structure 40 may be disposed in the first region 10A, which is exposed from the second conductive structure 20, and adjacent to the boundary between the first region 10A and the second region 10B. The dam structure 40 may be disposed on at least one side 30S of the electronic component 30, depending on the location of the first interconnectors 14. By way of example, the dam structure 40 may surround four sides 30S of the electronic component 30 in case the first interconnectors 14 are disposed on four sides 30S of the electronic component 30.

In some embodiments, the dam structure 40 may protrude from the upper surface 101 of the first conductive structure 10. The difference in elevation between the dam structure 40 and the upper surface 101 forms a reservoir for accommodating the excessive underfill 32, and prevents the excessive underfill 32 from bleeding to approach the first interconnectors 14. The height of the dam structure 40 may be modified based on the amount variation of the underfill 32. For example, the top of the dam structure 40 may be lower than, substantially leveled with or higher than the bottom surface (e.g., active surface) of the electronic component 30. The cross-sectional shape of the dam structure 40 may include rectangular shape, trapezoid shape, inverse trapezoid shape, step shape or any other shapes. In some embodiments, the dam structure 40 may be a protrusion of the first circuit layer 12 such as a protrusion of the uppermost insulative layer 12D, and may be patterned simultaneously with the uppermost insulative layer 12D. Alternatively or additionally, the dam structure 40 may include a protrusion of another material layer such as a passivation layer or a conductive layer.

In some other embodiments, the dam structure 40 may be recessed from the upper surface 101 of the first conductive structure 10. The difference in elevation between the recess and the upper surface 101 also forms a reservoir for accommodating the excessive underfill 32, and prevents the excessive underfill 32 from bleeding to approach the first interconnectors 14. For example, the recess of the dam structure 40 may be formed by recessing the uppermost insulative layer 12D.

The electronic package 1 may further include an encapsulant 50 disposed in the cavity 20C and encapsulates the electronic component 30. The encapsulant 50 may encapsulate the sides 30S of the electronic component 30. In some embodiments, the upper surface 30U of the electronic component 30 may be lower than the upper surface 201 of the second conductive structure 20, and the encapsulant 50 may further encapsulate the upper surface 30U of the electronic component 30. The material of the encapsulant 50 may include molding compound such as epoxy-based material (e.g. FR4), resin-based material (e.g. Bismaleimide-Triazine (BT)), Polyimide (PI)) or other suitable materials. The encapsulant 50 may further encapsulate the dam structure 40, and extend into the space between the first conductive structure 10 and the second conductive structure 20 to encapsulate the first interconnectors 14. In some embodiments, an upper surface 50U of the encapsulant 50 and the upper surface 201 of the second conductive structure 20 may be substantially coplanar. In some other embodiments, the upper surface 30U of the electronic component 30, the upper surface 50U of the encapsulant 50 and the upper surface 201 of the second conductive structure 20 may be substantially coplanar. In some embodiments, electrical conductors 18 such as solder balls are disposed on the lower surface 102 of the first conductive structure 10 and configured to electrically connect the first conductive structure 10 to an external electronic device such as a printed circuit board (PCB).

The dam structure 40 of the electronic package 1 is able to confine the locations of the underfill 32 and prevent the underfill 32 from bleeding and contaminating electrical interconnection between the first conductive structure 10 and the second conductive structure 20. Accordingly, the reliability of the electrical connection between the first conductive structure 10 and the second conductive structure 20 can be ensured. In addition, the cavity 20C of the second conductive structure 20 can accommodate the electronic component 30, and thus the overall thickness of the electronic package 1 can be reduced.

The electronic packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2:
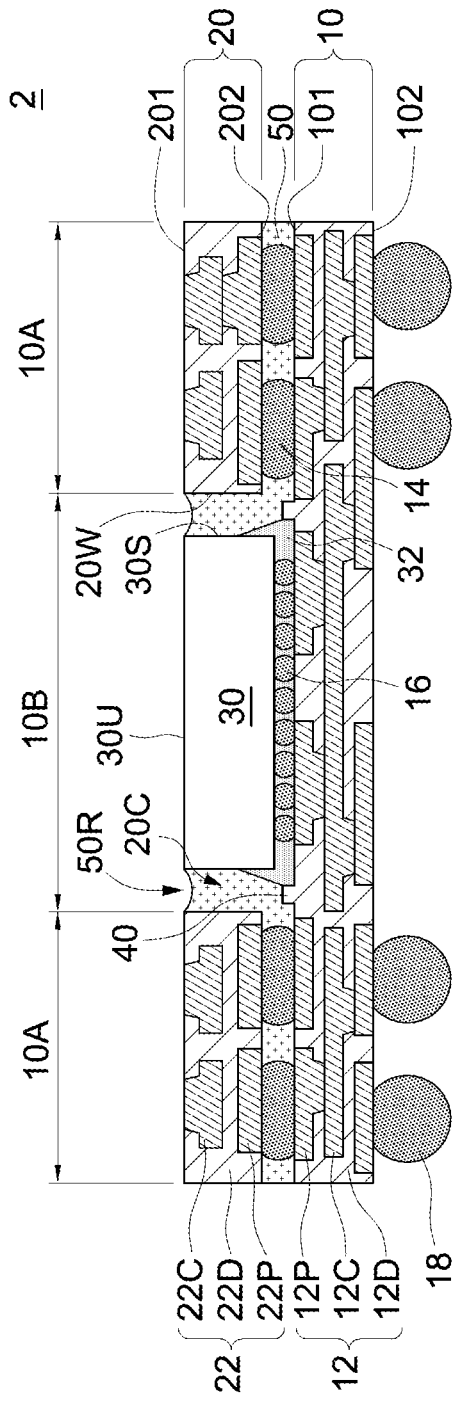
FIG. 2 is a schematic cross-sectional view of an electronic package in accordance with some embodiments of the present disclosure.

FIG. 2 is a schematic cross-sectional view of an electronic package 2 in accordance with some embodiments of the present disclosure. As shown in FIG. 2, in contrast to the electronic package 1 of FIG. 1A, the upper surface 30U of the electronic component 30 of the electronic package 2 is exposed from the encapsulant 50. In some embodiments, the upper surface 30U of the electronic component 30 and the upper surface 201 of the second conductive structure 20 may be substantially coplanar. The upper surface 50U of the encapsulant 50 may include one or more recesses 50R between the electronic component 30 and the second conductive structure 20. In some embodiments, the recess 50R may include a hollow frame shape when viewed from the top of the second conductive structure 20.

Figure 3:
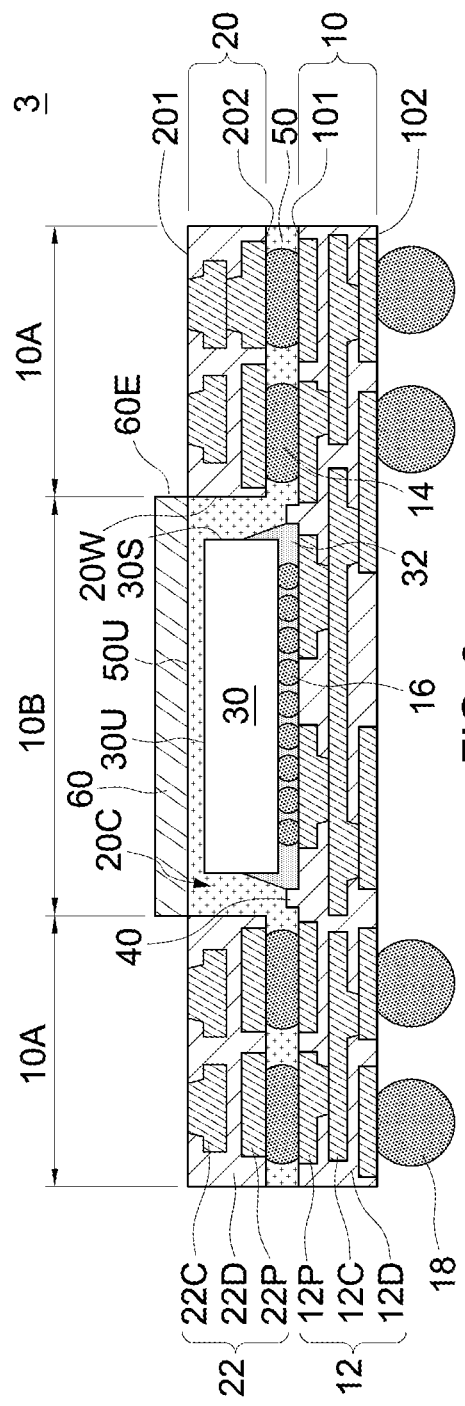
FIG. 3 is a schematic cross-sectional view of an electronic package in accordance with some embodiments of the present disclosure.

FIG. 3 is a schematic cross-sectional view of an electronic package 3 in accordance with some embodiments of the present disclosure. As shown in FIG. 3, in contrast to the electronic package 1 of FIG. 1A, the electronic package 3 further includes a stress compensation layer 60 disposed on the cavity 20C and the encapsulant 50. In some embodiments, an edge 60E of the stress compensation layer 60 is substantially aligned with the sidewall 20W of the cavity 20C. The stress compensation layer 60 is configured to compensate for the stress deviation due to the configuration of the cavity 20C of the second conductive structure 20, so as to alleviate warpage issue due to stress deviation. The modulus of elasticity of the stress compensation layer 60 is different from that of the first conductive structure 10. For example, the modulus of elasticity of the stress compensation layer 60 is higher than that of the first conductive structure 10. Material of the stress compensation layer 60 may include an insulative layer such as a polymeric layer, a glue layer, a conductive layer such as a metal layer (e.g., copper layer), a molding compound layer or other structural layer based on the requirement for modulus of elasticity. In some embodiments, the thickness of the stress compensation layer 60 may be greater than 0 micrometer and less than or substantially equal to about 20 micrometers. The thickness s of the stress compensation layer 60 may be selected based on the required stress for compensating the warpage.

Figure 3A:
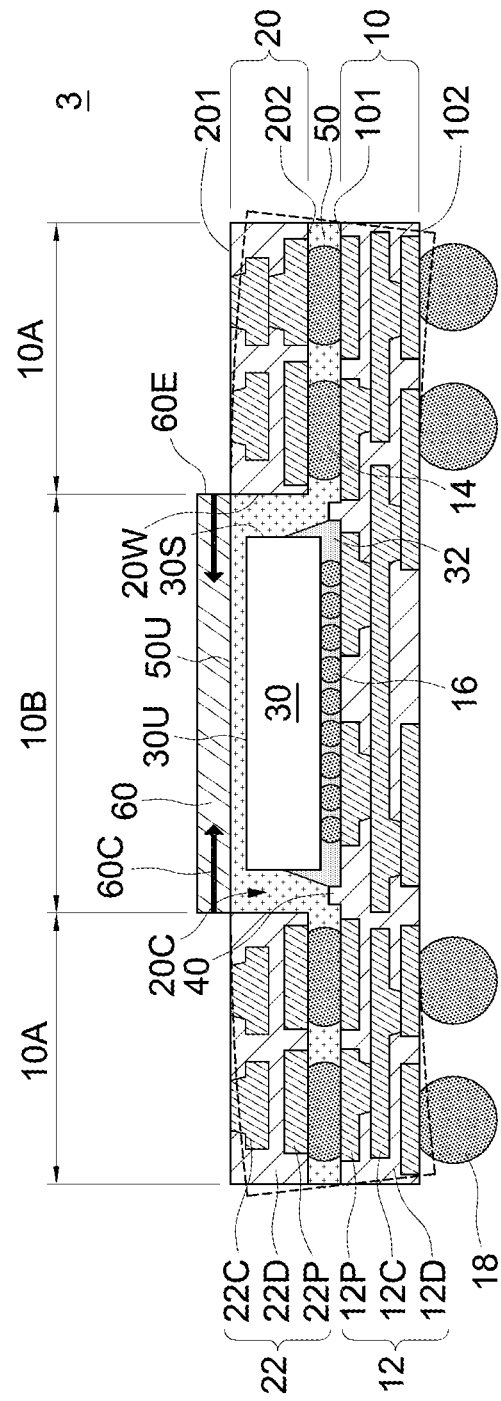
FIG. 3A is a schematic view illustrating the stress compensation layer providing a compressive stress on the underlying layers of the electronic package.

FIG. 3A is a schematic view illustrating the stress compensation layer 60 providing a compressive stress on the underlying layers of the electronic package 3, and FIG. 3B is a schematic view illustrating the stress compensation layer 60 providing a tensile stress on the underlying layers of the electronic package 3. In some embodiments, the contraction of the first conductive structure 10 is higher compared to that of the second conductive structure 20 at lower temperature such as at room temperature, and thus the electronic package 3 may be subject to a convex warpage (e.g. crying warpage). As shown in FIG. 3A, the stress compensation layer 60 may provide a compressive stress 60C on the underlying layers of the electronic package 3 to alleviate the convex warpage. In some embodiments, the contraction of the first conductive structure 10 is lower compared to that of the second conductive structure 20 at high temperature, and thus the electronic package 3 may be subject to a concave warpage (e.g. smile warpage). As shown in FIG. 3B, the stress compensation layer 60 may provide a tensile stress 60T on the underlying layers of the electronic package 3 to alleviate the concave warpage.

FIG. 4 is a schematic cross-sectional view of an electronic package 4 in accordance with some embodiments of the present disclosure. As shown in FIG. 4, in contrast to the electronic package 3 of FIG. 3, the stress compensation layer 60 is a protruding portion of the encapsulant 50. The stress compensation layer 60 is formed of the same molding material as the encapsulant 50 and simultaneously with the encapsulant 50.

Table 1 lists a simulation result showing warpage of several electronic packages at room temperature and high temperature. Sample 1 is an electronic package without any stress compensation layer; Sample 2 is an electronic package including a glue layer configured as a stress compensation layer; Sample 3 is an electronic package including an over molding layer (a protruding portion of the encapsulant) configured as a stress compensation layer; Sample 4 is an electronic package including a copper layer configured as a stress compensation layer.

TABLE 1

|  | Sample 1 | Sample 2 | Sample 3 | Sample 4 |
| --- | --- | --- | --- | --- |
| Warpage at high temperature | 163 μm | 163 μm | 153 μm | 140 μm |
| Warpage at room temperature | −63 μm | −62 μm | −61 μm | −62 μm |

As shown in Table 1, compared to Sample 1, Samples 2-3 which use various stress compensation materials can alleviate positive warpage normally occurring at room temperature and negative warpage normally occurring at high temperature.

Figure 5A:
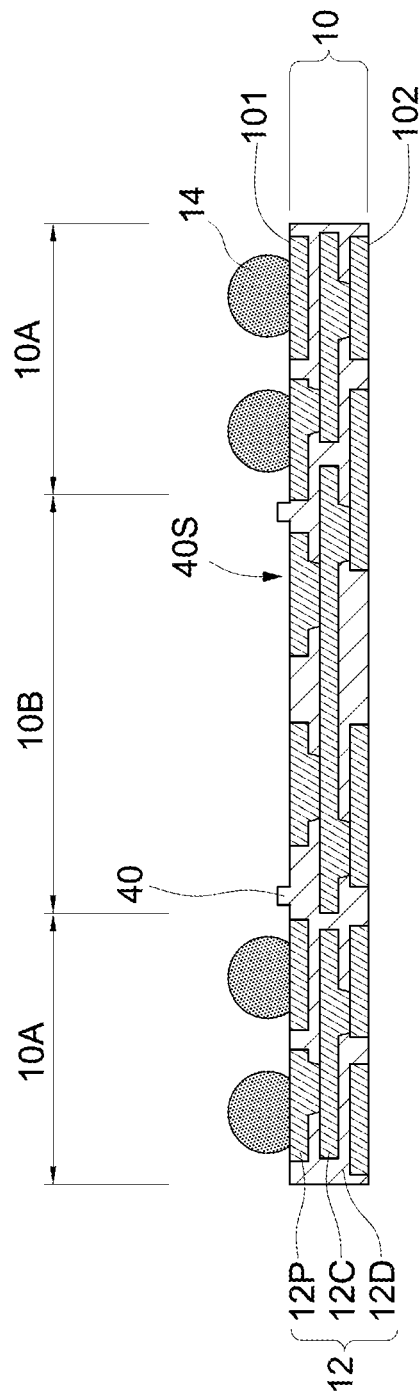

FIG. 5A, FIG. 5B, FIG. 5C, FIG. 5D, FIG. 5E and FIG. 5F illustrate operations of manufacturing an electronic package 1 or 3 in accordance with some embodiments of the present disclosure. As shown in FIG. 5A, a first conductive structure 10 is provided. In some embodiments, the first conductive structure 10 may include a dam structure 40 formed on an upper surface 101 of the first conductive structure 10. The dam structure 40 may be formed simultaneously with or subsequent to formation of the circuit layer 12. The dam structure 40 may be formed by an addition process which adds a structure on the first conductive structure 10, a subtraction process which removes a portion of the structure of the first conductive structure 10, or a combination of an addition process and a subtraction process. In some embodiments, first interconnectors 14 such as solder balls can be formed on the first conductive structure 10.

Figure 5B:
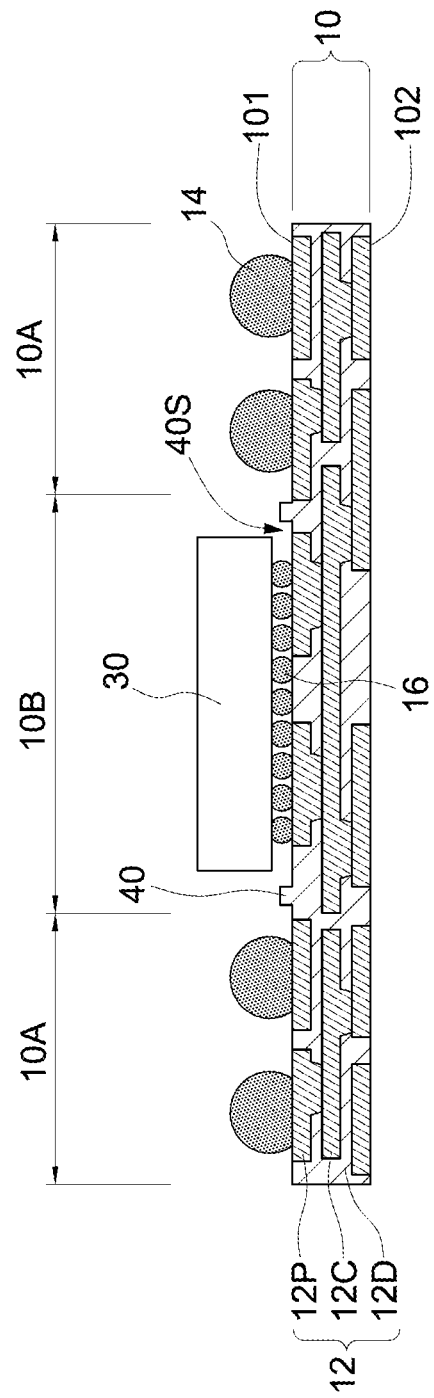
Figure 5C:
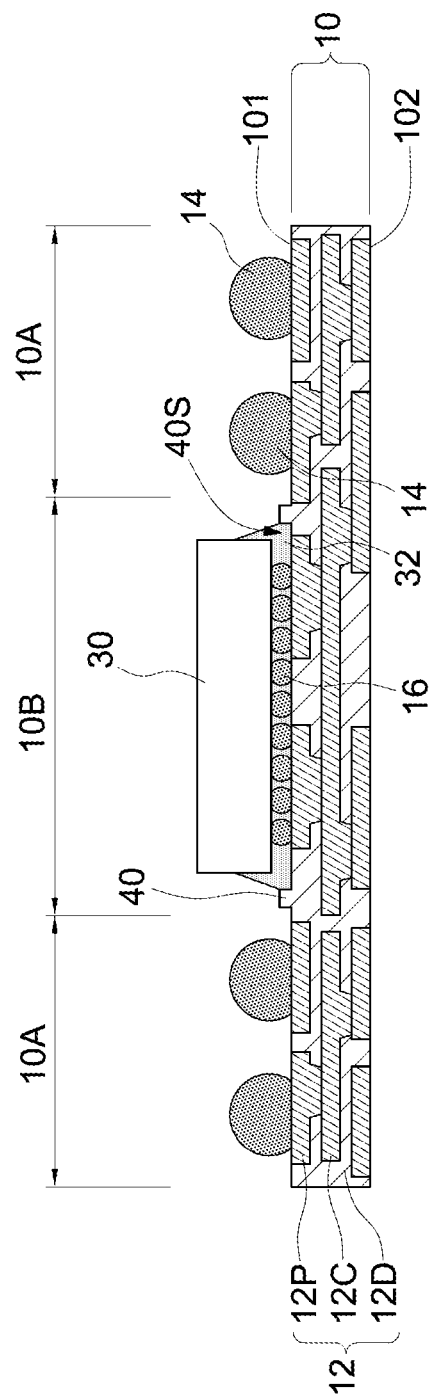

As shown in FIG. 5B, an electronic component 30 is bonded to the upper surface 101 of the first conductive structure 10 in a space 40S defined by the dam structure 40. The electronic component 30 may be bonded to and electrically connected to the first conductive structure 10 by interconnectors 16 such as micro solder bumps. As shown in FIG. 5C, an underfill 32 is dispended between the electronic component 40 and the first conductive structure 10. The underfill 32 may be filled between the electronic component 30 and the first conductive structure 10 by capillary action. Meanwhile, the underfill 32 is constrained in the space 40S by the dam structure 40. Accordingly, the underfill 32 is blocked from the first interconnectors 14.

Figure 5D:
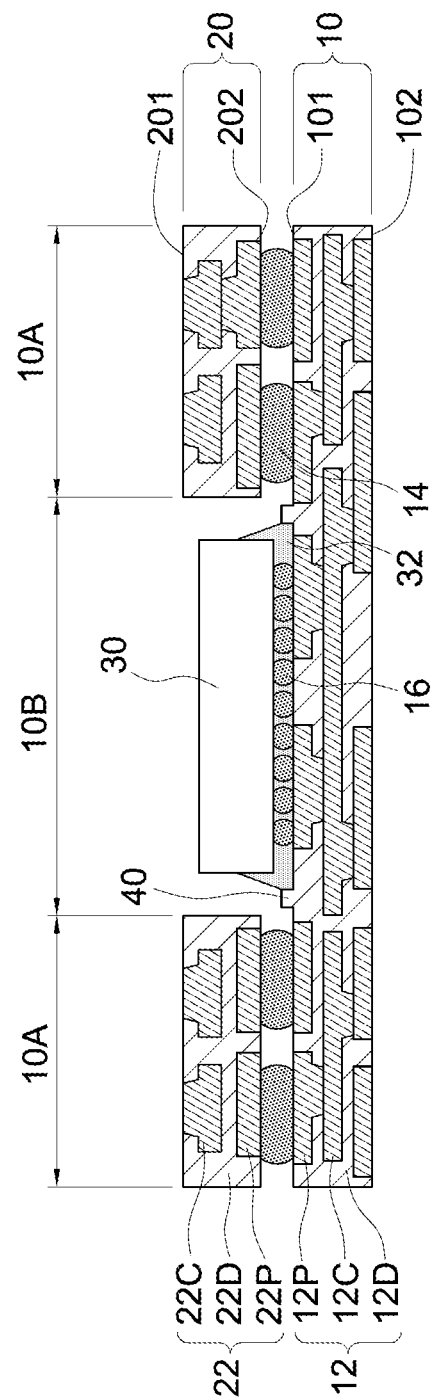

As shown in FIG. 5D, a second conductive structure 20 including a cavity 20C is provided. The second conductive structure 20 is disposed on the first conductive structure 10 with the cavity 20C receiving the electronic component 30. As shown in FIG. 5E, an encapsulant 50 is formed in the cavity 20C to encapsulate the electronic component 30 subsequent to the second conductive structure 20 is disposed on the first conductive structure 10. In some embodiments, a mold chase 70 including a lower mold 72 and an upper mold 74 is provided, and a molding compound is introduced along a mold flow direction Dm in the cavity 20C using the mold chase 70 to perform a molding process to form the encapsulant 50. After the encapsulant 50 is formed, the mold chase 70 is released from the encapsulant 50. Electrical conductors 18 such as solder balls may be disposed on the lower surface 102 of the first conductive structure 10 to form the electronic package 1 as illustrated in FIG. 1A.

In some other embodiments, a stress compensation layer 60 may be formed on the cavity 20C as shown in FIG. 5F. The stress compensation layer 60 may be formed by globally forming a stress compensation material on the upper surface 201 of the second conductive structure 20 and the encapsulant 50, and then patterning the stress compensation material to form the stress compensation layer 60 corresponding to the cavity 20C. By way of examples, the stress compensation material may be formed by depositing, coating, electroplating or other suitable methods, and patterned by photolithography, lift off or other suitable methods. Electrical conductors 18 such as solder balls may be disposed on the lower surface 102 of the first conductive structure 10 to form the electronic package 3 as illustrated in FIG. 3.

FIG. 6A and FIG. 6B illustrate operations of manufacturing an electronic package 4 in accordance with some embodiments of the present disclosure. As shown in FIG. 6A, an encapsulant 50 is formed in the cavity 20C to encapsulate the electronic component 30. In contrast to FIG. 5E, the upper mold 74 is spaced away from second conductive structure 20 such that the encapsulant 50 is thicker and further covers the upper surface 201 of the second conductive structure 20. As shown in FIG. 6B, the encapsulant 50 is patterned to remove a portion of the encapsulant 50 on the second conductive structure 20 such that a protruding portion of the encapsulant 50 disposed on electronic component 30 and higher than the second conductive structure 20 forms a stress compensation layer 60. Electrical conductors 18 such as solder balls may be disposed on the lower surface 102 of the first conductive structure 10 to form the electronic package 4 as illustrated in FIG. 4.

FIG. 7A and FIG. 7B illustrate operations of manufacturing an electronic package 2 in accordance with some embodiments of the present disclosure. As shown in FIG. 7A, an encapsulant 50 is formed in the cavity 20C to encapsulate the electronic component 30. In contrast to FIG. 5E, the mold chase 70 further includes a release film 76 to facilitate the release of the mold chase 70 from the encapsulant 50 and/or to reduce the thickness of the encapsulant 50. The release film 76 is between the upper mold 72 and the electronic component 30 and also the upper mold 72 and the second conductive structure 20. The release film 76 may include a tape or other soft or flexible material, and thus may slightly sag. A molding compound is introduced in the cavity 20C using the mold chase 70 to perform a molding process to form the encapsulant 50. Accordingly, one or more recesses 50R of the encapsulant 50 may appear between the electronic component 30 and the second conductive structure 20. The mold chase 70 is removed. Electrical conductors 18 such as solder balls may be disposed on the lower surface 102 of the first conductive structure 10 to form the electronic package 2 as illustrated in FIG. 2.

In some embodiments, the upper mold 74 is spaced away from second conductive structure 20 such that the encapsulant 50 is thicker and further covers the upper surface 201 of the second conductive structure 20. As shown in FIG. 6B, the encapsulant 50 is patterned to remove a portion of the encapsulant 50 to expose the upper surface 201 of the second conductive structure 20, while a protruding portion of the encapsulant 50 over the cavity 20C is reserved and configured as the stress compensation layer 60. Electrical conductors 18 such as solder balls may be disposed on the lower surface 102 of the first conductive structure 10 to form the electronic package 4 as illustrated in FIG. 4.

In some embodiments of the present disclosure, an electronic package including a dam structure is provided. The dam structure can confine locations of an underfill and prevent the underfill from contaminating electrical interconnection between two stacked conductive structures adjacent to the underfill. Accordingly, electrical connection between the stacked conductive structures can be ensured. The electronic package further includes a cavity in the overlying conductive structure for accommodating an electronic component, and thus the overall thickness of the electronic package can be reduced. The electronic package may further include a stress compensation layer disposed correspondingly to the cavity of the overlying conductive structure. The stress compensation layer can compensate for the unbalanced stress distribution due to the configuration of the cavity, which is formed by partially removing the overlying conductive structure. Accordingly, warpage issue of the electronic package can be alleviated.

In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations per-formed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
a first conductive structure;
a second conductive structure disposed over the first conductive structure, wherein the second conductive structure defines a cavity over the first conductive structure;
an electronic component disposed over the first conductive structure and at least partially disposed in the cavity;
an underfill disposed between the first conductive structure and the electronic component; and
a dam structure disposed on the first conductive structure and configured to confine the underfill,
wherein the dam structure protrudes from the first conductive structure, an inner surface of the dam structure is in contact with the underfill, and the inner surface of the dam structure is not exposed from the underfill in a cross-sectional view,
and wherein the electronic component has a bottom surface facing the first conductive structure, and a level of a top surface of the dam structure is lower than a level of the bottom surface of the electronic component.

2. The electronic package according to claim 1, wherein the level of the top surface of the dam structure is lower than a level of a top surface of the underfill.

3. The electronic package according to claim 2, wherein the level of the top surface of the dam structure is lower than a level of a bottom surface of the second conductive structure that faces the first conductive structure.

4. The electronic package according to claim 1, wherein a level of a top surface of the electronic component is lower than a level of a top surface of the second conductive structure.

5. The electronic package according to claim 4, further comprising:
an encapsulant disposed within the cavity, wherein the encapsulant encapsulates the top surface and a lateral surface of the electronic component.

6. The electronic package according to claim 5, wherein a top surface of the encapsulant is substantially aligned with the top surface of the second conductive structure.

7. The electronic package according to claim 5, wherein a thickness of the encapsulant on the top surface of the electronic component is less than a width of the encapsulant between the lateral surface of the electronic component and an inner surface of the second conductive structure.

8. The electronic package according to claim 1, wherein a level of a bottom surface of the second conductive structure is higher than the level of the bottom surface of the electronic component.

9. An electronic package, comprising:
a first conductive structure;
a second conductive structure disposed over the first conductive structure, wherein the second conductive structure defines a cavity over the first conductive structure;
an electronic component disposed over the first conductive structure and at least partially disposed in the cavity;
an underfill disposed between the first conductive structure and the electronic component; and
a dam structure disposed on the first conductive structure and configured to confine the underfill,
wherein the dam structure protrudes from the first conductive structure, an inner surface of the dam structure is in contact with the underfill, and the inner surface of the dam structure is not exposed from the underfill in a cross-sectional view,
and wherein the second conductive structure is electrically connected to the first conductive structure through a first interconnector, the electronic component is electrically connected to the first conductive structure through a second interconnector, the dam structure is free from overlapping the second conductive structure along a direction which is substantially perpendicular to a top surface of the first conductive structure, and the first interconnector is closer to the dam structure than the second interconnector is.

10. An electronic package, comprising:
a first conductive structure;
a second conductive structure disposed over the first conductive structure, wherein the second conductive structure defines a cavity over the first conductive structure;
an electronic component disposed over the first conductive structure and at least partially disposed in the cavity;
an underfill disposed between the first conductive structure and the electronic component; and
a dam structure disposed on the first conductive structure and configured to confine the underfill,
wherein the dam structure protrudes from the first conductive structure, an inner surface of the dam structure is in contact with the underfill, and the inner surface of the dam structure is not exposed from the underfill in a cross-sectional view,
and wherein the first conductive structure comprises an insulative layer, and the dam structure and the insulative layer are monolithic.

11. An electronic package, comprising:
a first conductive structure;
a second conductive structure disposed over the first conductive structure, wherein the second conductive structure defines a cavity over the first conductive structure;
an electronic component disposed over the first conductive structure and at least partially disposed in the cavity;
a stress compensation layer disposed on the cavity; and
an encapsulant disposed within the cavity and encapsulating the electronic component, wherein the encapsulant is located between the electronic component and the stress compensation layer,
and wherein an edge of the stress compensation layer is substantially aligned with a sidewall of the cavity.

12. The electronic package according to claim 11, wherein a modulus of the stress compensation layer is greater than that of the first conductive structure.

13. The electronic package according to claim 11, wherein a width of the stress compensation layer is greater than a width of the electronic component.

14. An electronic package, comprising:
a first conductive structure;

a second conductive structure disposed over the first conductive structure, wherein the second conductive structure defines a cavity over the first conductive structure;

an electronic component disposed over the first conductive structure and at least partially disposed in the cavity;

a stress compensation layer disposed on the cavity; and an encapsulant disposed within the cavity and encapsulating the electronic component, wherein the encapsulant is located between the electronic component and the stress compensation layer, and wherein the second conductive structure comprises an inner via, and a diameter of the inner via is tapered along a direction far from the first conductive structure.

15. The electronic package according to claim 14, wherein the stress compensation layer is configured to provide a tensile stress.

16. The electronic package according to claim 14, wherein the stress compensation layer is in contact with the encapsulant.

17. The electronic package according to claim 16, wherein a lateral surface of the encapsulant is substantially aligned with an edge of the stress compensation layer.

18. The electronic package according to claim 14, wherein the encapsulant has a first portion extending between the second conductive structure and the first conductive structure and a second portion above the electronic component, and a thickness of the second portion of the encapsulant is less than a thickness of the first portion of the encapsulant.

* * * * *